United States Patent
Liu et al.

(10) Patent No.: US 10,349,550 B2
(45) Date of Patent: Jul. 9, 2019

(54) GUIDERAIL FOR A CABINET, CHASSIS AND CABINET

(71) Applicant: EMC IP Holding Company LLC, Hopkinton, MA (US)

(72) Inventors: Alice Aiqin Liu, Shanghai (CN); Qingqiang Guo, Shanghai (CN); Haifang Zhai, Shanghai (CN); Jacky Jianguo Pang, Shanghai (CN); Michael Hao Zhou, Shanghai (CN)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 15/846,404

(22) Filed: Dec. 19, 2017

(65) Prior Publication Data
US 2018/0177071 A1    Jun. 21, 2018

(30) Foreign Application Priority Data
Dec. 21, 2016  (CN) .......................... 2016 1 1193308

(51) Int. Cl.
*H05K 7/14* (2006.01)
(52) U.S. Cl.
CPC ................................. *H05K 7/1489* (2013.01)
(58) Field of Classification Search
CPC ..... A47B 88/43; A47B 88/423; H05K 7/1489
USPC .......................................... 312/334.4, 334.5
See application file for complete search history.

(56) References Cited

U.S. PATENT DOCUMENTS

| | | | | | |
|---|---|---|---|---|---|
| 5,460,441 | A | * | 10/1995 | Hastings | G06F 1/184 312/138.1 |
| 8,033,621 | B2 | * | 10/2011 | Liang | H05K 7/1489 312/334.4 |
| 8,322,668 | B2 | * | 12/2012 | Tang | H05K 7/1489 211/175 |
| 8,721,012 | B2 | * | 5/2014 | Chen | A47B 88/49 211/26 |
| 8,843,052 | B2 | * | 9/2014 | Yokoyama | F16C 29/04 399/393 |
| 8,967,744 | B2 | * | 3/2015 | Chen | H05K 7/1489 312/334.4 |
| 2008/0036347 | A1 | * | 2/2008 | Liang | H05K 7/1489 312/334.5 |
| 2010/0007249 | A1 | * | 1/2010 | Brown | F25D 23/021 312/109 |
| 2012/0128278 | A1 | * | 5/2012 | Chen | A47B 88/40 384/26 |

* cited by examiner

*Primary Examiner* — Matthew W Ing
(74) *Attorney, Agent, or Firm* — BainwoodHuang

(57) ABSTRACT

Embodiments of the present disclosure relate to a guiderail for a cabinet, a chassis and a cabinet. Specifically, the present disclosure discloses a guiderail (1) used in a cabinet (100) and the corresponding chassis (2) and the cabinet (100). The guiderail (1) is mounted in the cabinet (100) and used to fix the chassis (2) which can accommodate storage processing units (3) with different dimensions. According to the present disclosure, the guiderail (1) comprises a main body part (10) and an extended part (30), wherein the main body part (10) is used to support the chassis (2) when it is inserted into the cabinet (100) along the guiderail (1); and the extended part (20) is used to fix the storage processing unit (3) extending from the chassis (2) so that storage processing units (3) of different dimensions can share the chassis (2) with the same specification.

20 Claims, 11 Drawing Sheets

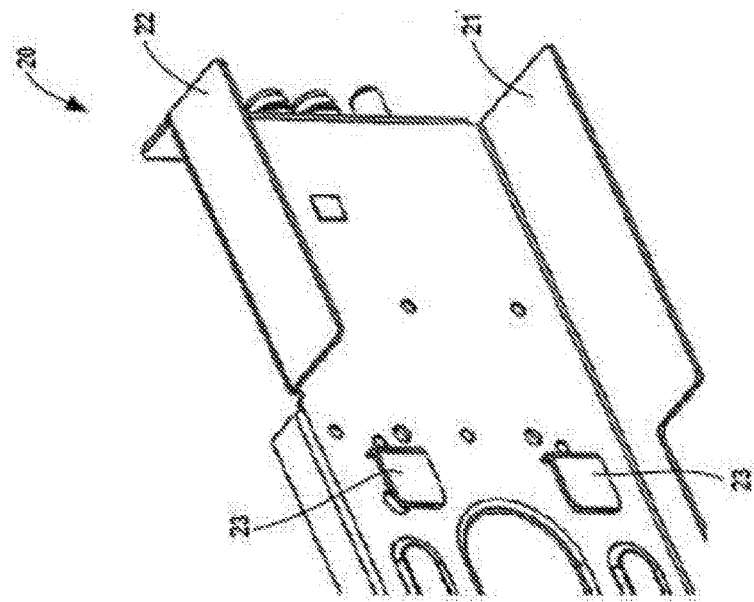
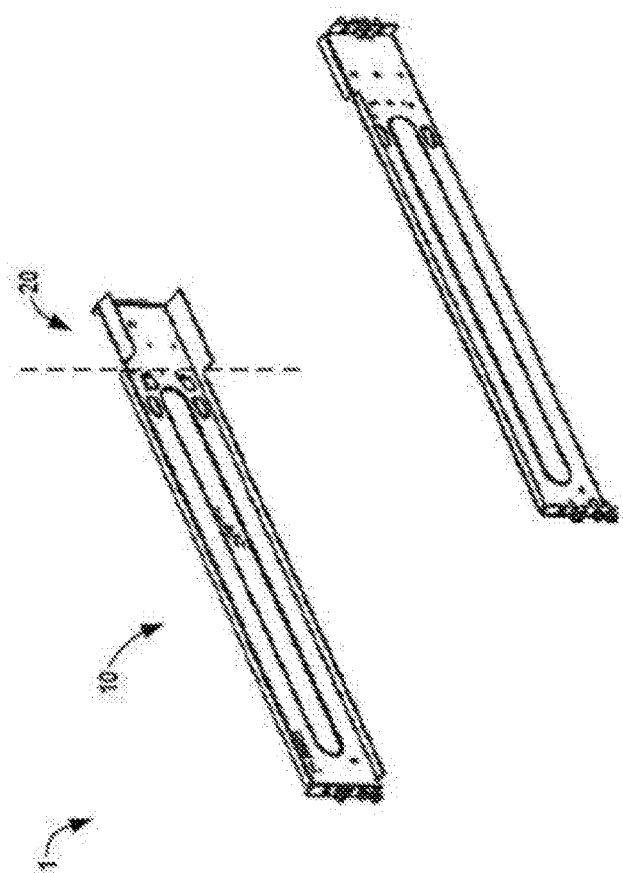
FIG. 4

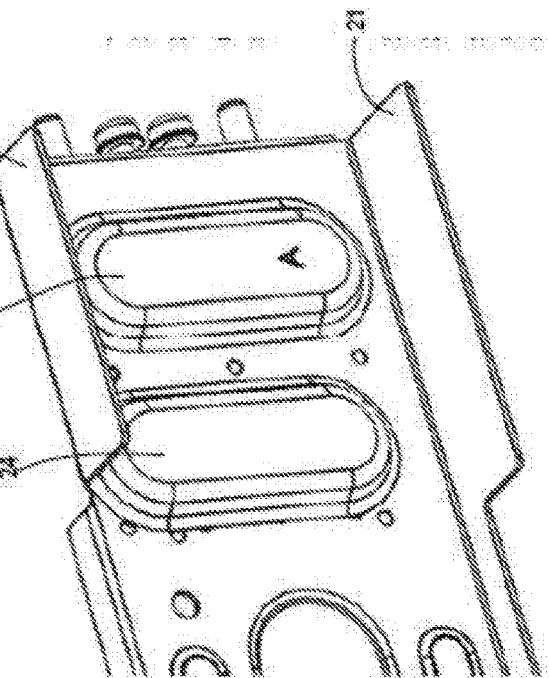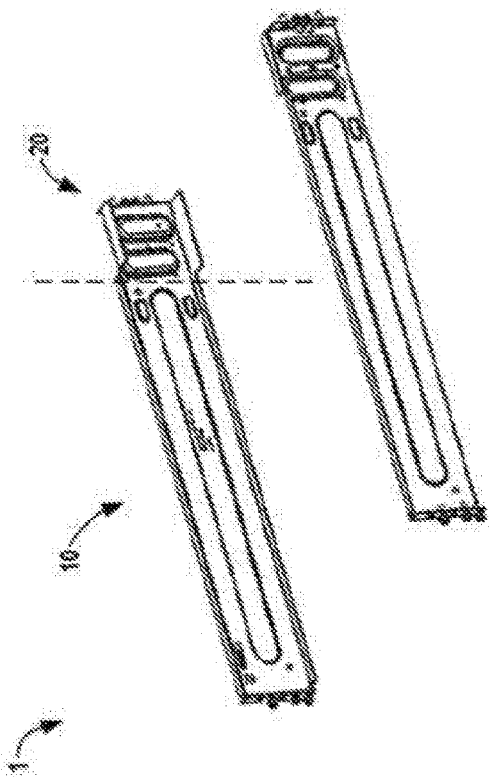
FIG. 5

GUIDERAIL FOR A CABINET, CHASSIS AND CABINET

FIELD

This application claim priority from Chinese Patent Application Number CN201611193308.8, filed on Dec. 21, 2016 at the State Intellectual Property Office, China, titled "RAIL FOR USE IN RACK, CHASSIS AND RACK" the contents of which is herein incorporated by reference in its entirety.

FIELD

Embodiments of the present disclosure generally relate to the storage system, and more specifically to a guiderail for fixing chassis in a cabinet. The present disclosure further relates to a chassis used in cooperation with the guiderail and a cabinet mounted with the guiderail.

BACKGROUND

When a data center is constructed or a storage system is mounted, it is generally necessary to firstly fix the storage processing unit in the chassis and then fasten the chassis to the cabinet. However, since the storage processing unit per se has different dimensions, a dedicated chassis should be designed for each type of the storage processing unit, which causes waste due to repeated design and huge production costs.

SUMMARY

Embodiments of the present disclosure provide a guiderail and the corresponding chassis and cabinet.

In first aspect of the present disclosure, a guiderail for use in the cabinet is provided. The guiderail is mounted in the cabinet and used to fix the chassis which can accommodate storage processing units of different dimensions. According to the present disclosure, the guiderail includes a main body part and an extended part, where the main body part is used to support the chassis when it is inserted into the cabinet along the guiderail; and the extended part is used to fix the storage processing unit extending from the chassis.

In some embodiments, the sidewall of the guiderail is configured to have such a height that the sidewall of the guiderail can cover the chassis in a vertical direction.

In some embodiments, the guiderail further includes a supporting portion, which is located at the lower side of the extended part of the guiderail to support the storage processing unit extending from the chassis.

In some embodiments, the guiderail further includes a fixing portion, which is located at the upper side of the extended part of the guiderail to fix the storage processing unit extending from the chassis between the supporting portion and the fixing portion.

In some embodiments, the guiderail further includes at least one embossment located on the sidewall of the extended part of the guiderail.

In some embodiments, the embossment and the extended part of the guiderail can form a one-piece construction.

In some embodiments, the guiderail further includes a hook which is used to engage with the chassis.

In some embodiments, the hook is arranged on the sidewall of the main body part of the guiderail.

In some embodiments, at least one of the embossments that is adjacent to the main body part of the guiderail and the hook form a separate one-piece construction, which is fixed on the sidewall of the extended part of the guiderail.

In some embodiments, the one-piece construction can be made of stainless steel.

In some embodiments, the main body part of the guiderail has a guide groove.

In second aspect of the present disclosure, a corresponding chassis is provided, which can accommodate storage processing units with different dimensions. When the chassis is inserted into a cabinet, the chassis can work in cooperation with the guiderail according to one of the embodiments of the present disclosure in order to be fixed in the cabinet.

In third aspect of the present disclosure, a cabinet is provided which is mounted with the guiderail according to one of the embodiments of the present disclosure in order to allow fixing the chassis with the guiderail.

BRIEF DESCRIPTION OF THE DRAWINGS

Through the following detailed description with reference to the accompanying drawings, the above and other objectives, features, and advantages of example embodiments of the present disclosure will become more apparent. Several example embodiments of the present disclosure will be illustrated by way of example but not limitation in the drawings in which:

FIG. 4 illustrates a third example of the guiderail according to the present disclosure;

FIG. 5 illustrates a fourth example of the guiderail according to the present disclosure;

Throughout the drawings, the same or similar reference symbols refer to the same or similar elements.

DETAILED DESCRIPTION OF EMBODIMENTS

Figure 1:
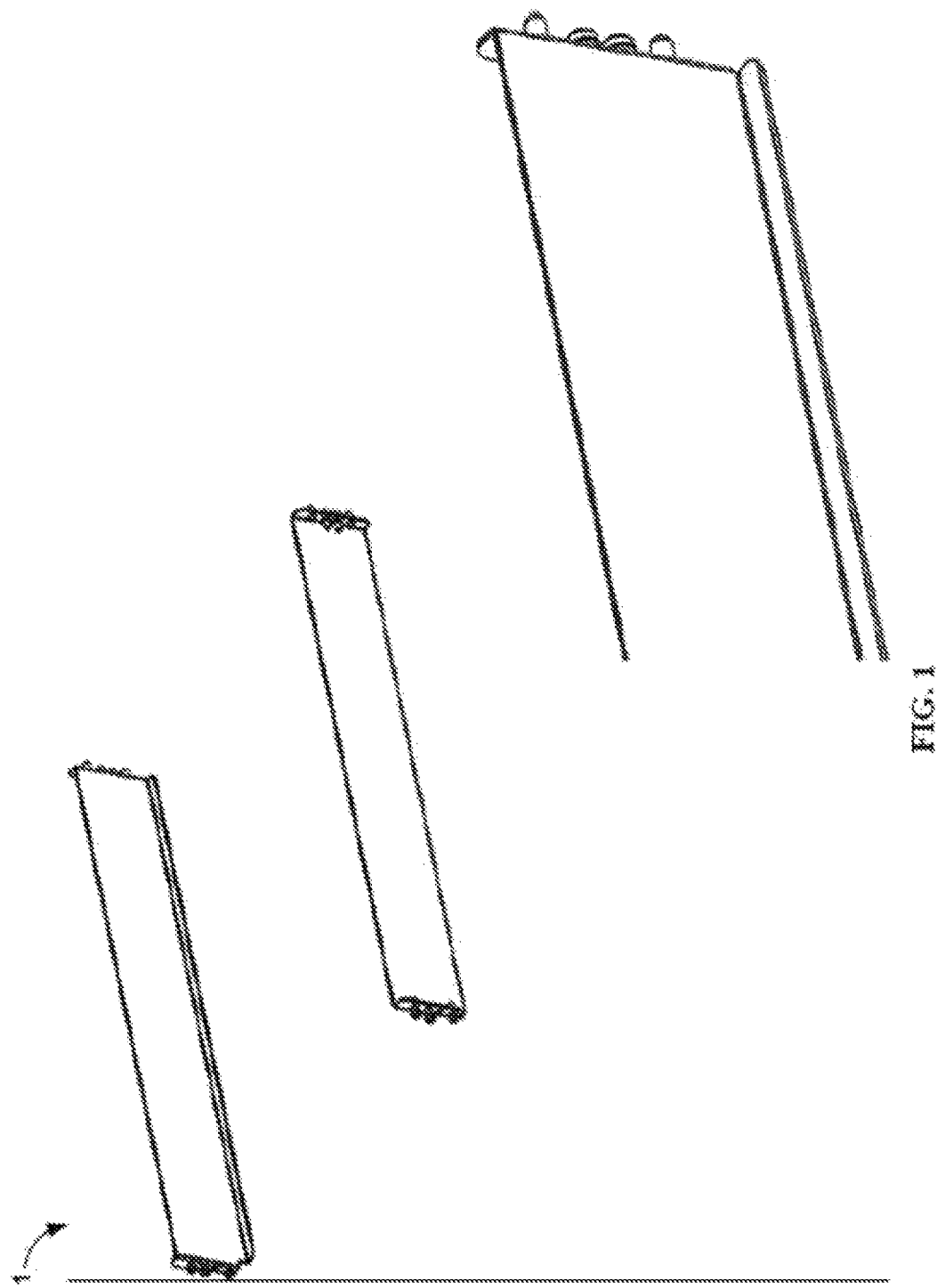
FIG. 1 illustrates a guiderail according to the conventional scheme.

FIG. 1 illustrates guiderail 1 according to the conventional scheme. In the conventional scheme, the length of the guiderail 1 is usually the same as the length of the chassis to be fixed. As a result, only a specialized storage processing unit can be mounted in the chassis. In other words, a dedicated chassis should be configured for each type of storage processing unit, particularly storage processing units with different dimensions.

Figure 2:
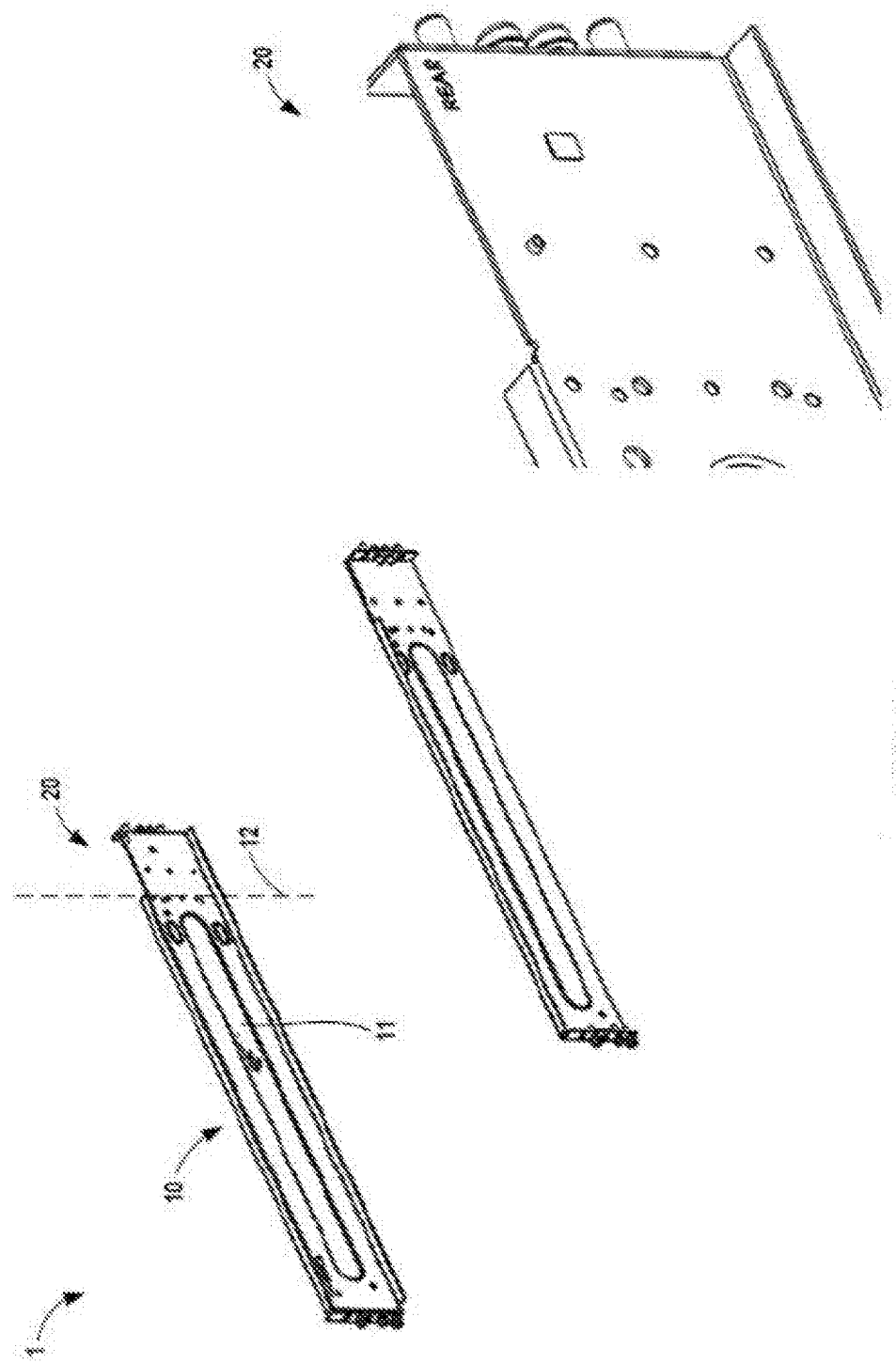
FIG. 2 illustrates a first example of the guiderail according to the present disclosure.

FIG. 2 illustrates a first example of guiderail 1 according to the present disclosure. The guiderail 1 includes a main body part 10 and an extended part 20 which are divided with a dotted line 12 in the figure. The length of the main body part 10 corresponds to that of the chassis. The main body part 10 is configured to support the chassis when the chassis is inserted into the cabinet along the guiderail 1. Compared with the conventional scheme, guiderail 1 is further configured with an extended part 20 whose length can be selected in a given range according to actual needs. The extended part 20 is configured to fix the storage processing unit extending from the chassis when a part of the storage processing unit extends from the chassis since the chassis cannot fully accommodate the storage processing unit. Thus, storage processing unit of different dimensions, for example, memory, can be mounted in the chassis. By means of the specifically designed guiderail 1, not only the chassis body can be fixed but also the storage processing unit that may extend from the chassis can be securely fixed, thereby enabling the chassis to share the storage processing unit of different dimensions.

In some embodiments, the sidewall of the guiderail 1 is configured to have such a height that the sidewall of the guiderail 1 can cover the chassis in vertical direction. In this manner, the support strength of guiderail 1 is improved. When a storage processing unit, for instance, with larger dimension and thus greater mass, is fixed in the chassis, the guiderail 1 can also meet the requirement for steady fixation.

In addition, optionally, in the embodiment described in FIG. 2, the main body 10 of guiderail 1 is further configured to have a guide groove 11 for guiding the chassis to move in the extending direction of the guide groove 11, so that the chassis can be inserted into or plugged out of the cabinet more easily.

Figure 3:
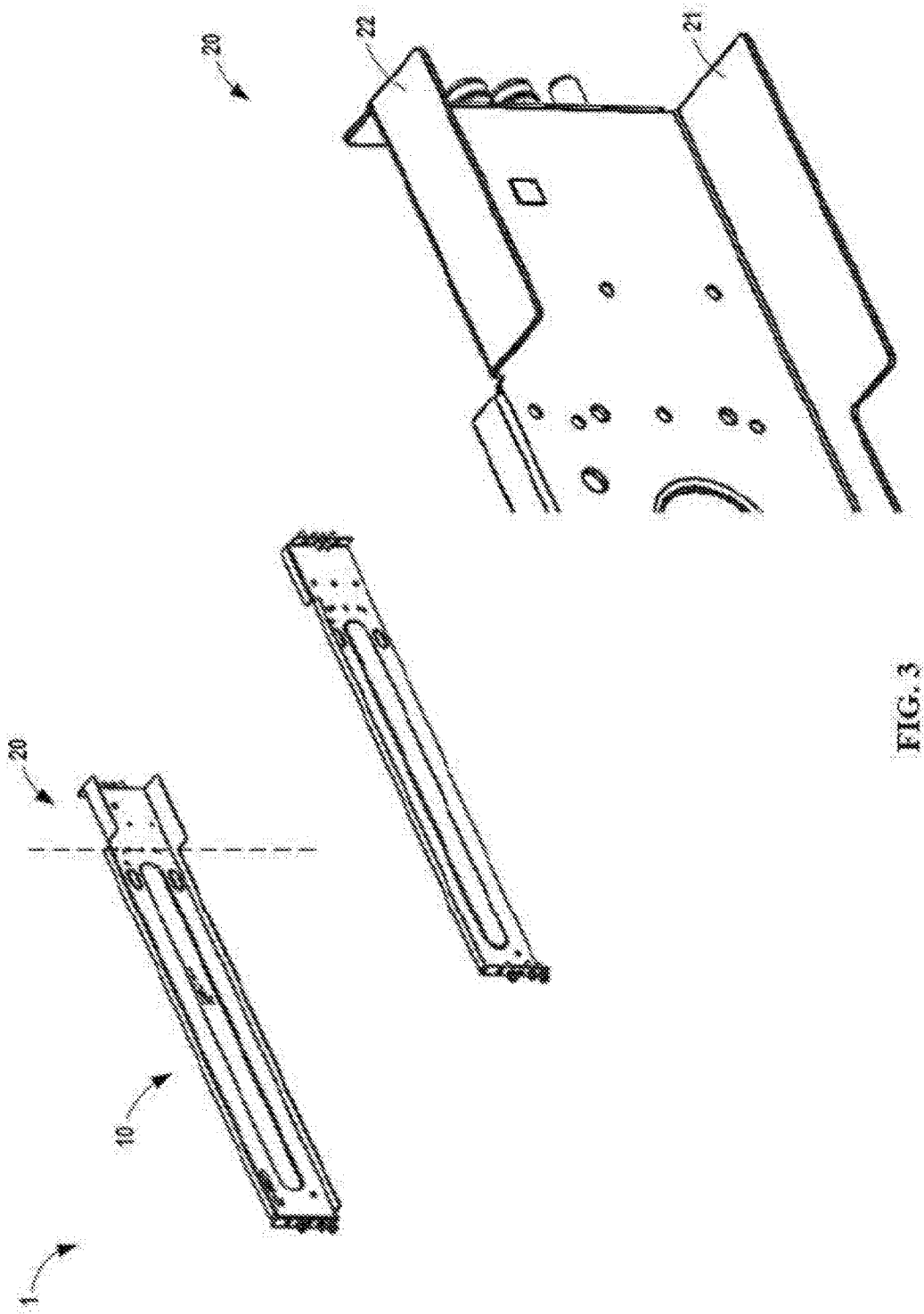
FIG. 3 illustrates a second example of the guiderail according to the present disclosure.

FIG. 3 illustrates a second example of the guiderail 1 according to the present disclosure. In the example, the lower side of the extended part 20 of guiderail 1 has wider support face than that of the main body part 10, thereby forming a supporting portion 21, with which the contact face between the guiderail and the storage processing unit can be enlarged to achieve steadier fixation. The L-shaped support face formed at the lower side of the whole guiderail 1 can increase structural strength of the guiderail 1, thereby carrying chassis and processing storage unit with greater mass.

In FIG. 3, optionally, the upper side of the extended part 20 of the guiderail 1 is configured to have a fixing portion 22 corresponding to the supporting portion 21. In this example, the distance between the supporting portion 21 and the fixing portion 22 is configured to enable the storing processing unit extending from the chassis to be inserted therebetween and contact therewith closely. In this embodiment, with the guiderail 1, the storage processing unit can be fixed at the upper side and the lower side respectively, which reduces the influence of vibration in the vertical direction for the storage process unit substantially. This kind of configuration can prevent the vibration generated in the vertical direction, particularly during the process of transportation or movement, from damaging the storage processing unit, thus enhancing the vibration-resistant performance of the product.

FIG. 4 illustrates a third example of the guiderail 1 according to the present disclosure. In this example, optionally, the main body part 10 of the guiderail 1 is configured to have a hook 23 at the inner side. When the chassis is inserted along the guiderail 1, the end of the case of the chassis is engaged in the guiderail 1 through the hook 23, thereby fixing the chassis and the storage processing unit inside in the longitudinal direction. In this respect, the number of the hook 23 is not limited. For cooperation with the hook groove configured correspondingly in the chassis, the hook 23 can also be configured in other positions to achieve the fixing effect. By establishing engaging connection between the guiderail 1 and the chassis, it can be ensured that the chassis is inserted in a proper position in the cabinet and connected securely with the main body part 10 of the guiderail 1. Furthermore, this kind of configuration can also reduce the influence of vibration for the storage processing unit in the inserting direction of the chassis, namely, the longitudinal direction.

In some embodiments, the hook 23 is configured on the sidewall of the main body part 10 of the guiderail 1. In this manner, the hook 23 can be manufactured with a simple process, thereby saving costs.

FIG. 5 illustrates a fourth example of guiderail 1 according to the present disclosure. In this example, optionally, the sidewall of the extended part 20 of the guiderail 1 is configured with two embossments 24, 25. As the portion of the storage processing unit extending from the chassis is generally slightly smaller than the width of the chassis in the horizontal direction, a gap may exist between the storage processing unit and the extended part of the guiderail. By filling the gap between the storage processing unit and the extended part 20 of the guiderail 1 well with the embossments 24, 25, the guiderail 1 can also fasten the storage processing unit in the horizontal direction, thus further enhancing mechanical stability. In the event of vibration in the horizontal direction, the influence of vibration for the storage processing unit can also be reduced in the horizontal direction with the embossments 24, 25.

In some embodiments, the embossments 24, 25 can be formed integrally with the guiderail 1. In this manner, embossments can be formed directly in the manufacturing process of the guiderail 1 instead of manufactured and mounted separately in additional processes, thereby simplifying the production method and saving manufacturing costs.

In some embodiments, the embossments 24, 25 can also be fixed on the guiderail 1 by means of bonding, welding and riveting and so on. In addition, the number of embossments can also be selected depending on different situations, which is not limited to the number shown in the figure.

Figure 6:
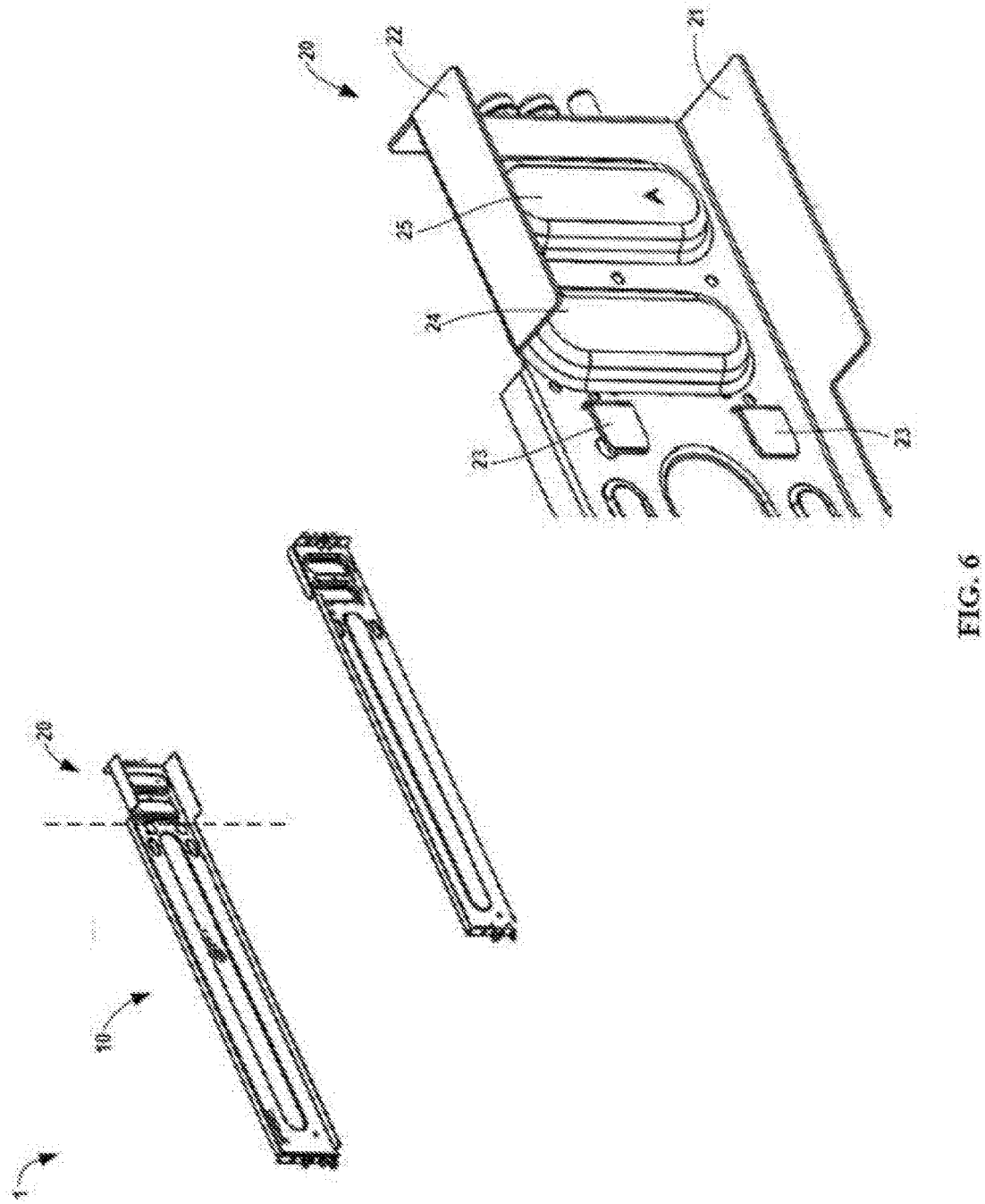
FIG. 6 illustrates a fifth example of the guiderail according to the present disclosure.

FIG. 6 illustrates a fifth example of the guiderail according to the present disclosure. In this example, optionally, the guiderail 1 is configured with a hook 23 illustrated with reference to FIG. 4 and embossments 24, 25 illustrated by means of FIG. 5, hence also possessing the advantage mentioned above, thus omitted here.

Figure 7:
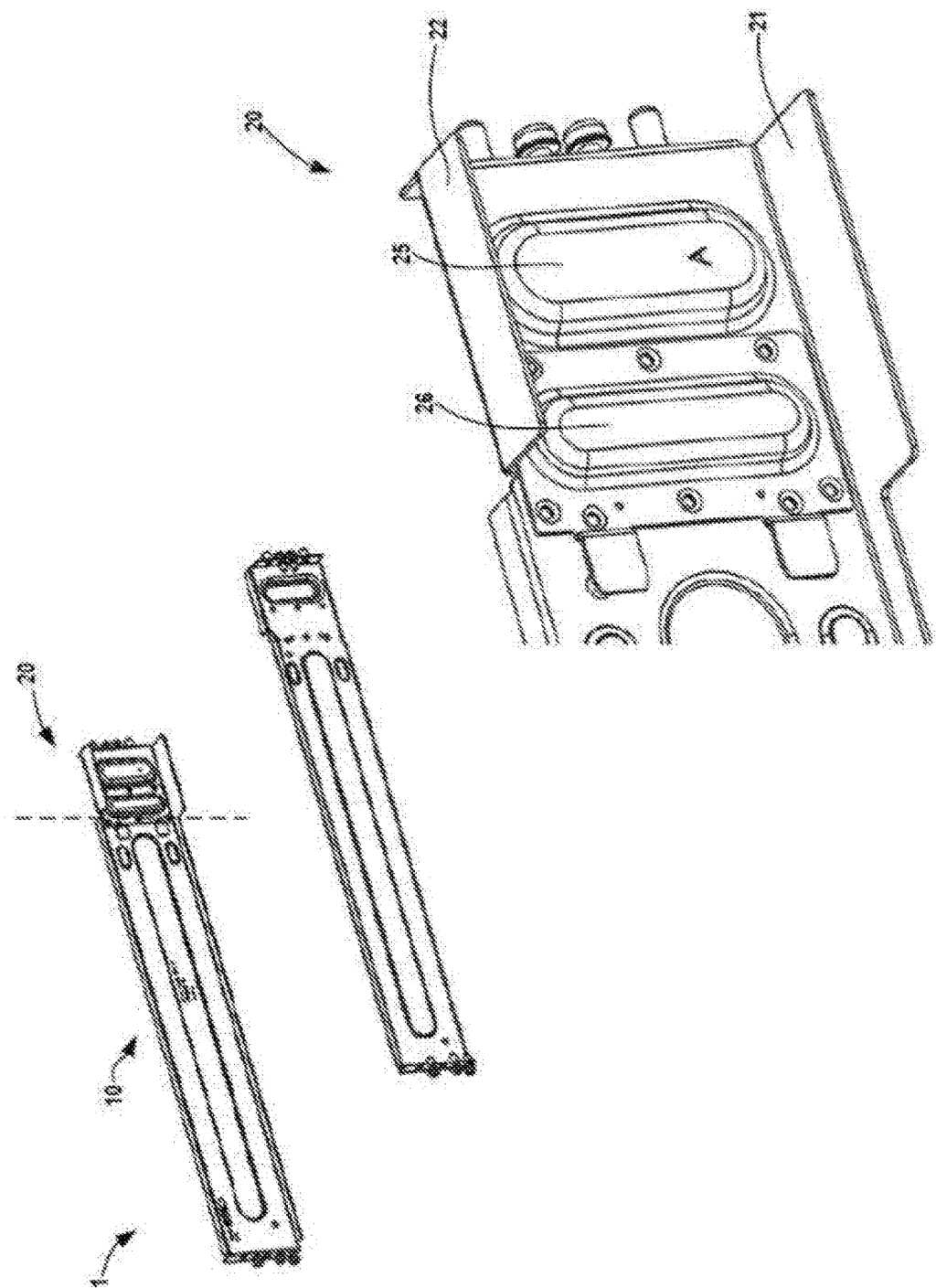
FIG. 7 illustrates a sixth example of the guiderail according to the present disclosure.

FIG. 7 illustrates a sixth example of the guiderail according to the present disclosure. Compared with the example shown in FIG. 6, optionally, the embossment 24 most adjacent to the main body part 10 of the guiderail 1 and hook 23 shown in FIG. 6 are replaced by a one-piece construction 26. Optionally, the one-piece construction 26 can be made of stainless steel and riveted to the extended part 20 of the guiderail 1. By constructing the hook 23 and the embossment 24 together, the mechanical strength of the hook 23 can be enhanced, thus expanding its service life and fixing the chassis and the storage processing unit inside more securely.

Naturally, in some embodiments, it is also possible to manufacture all the embossments 24 and 25 and the hook 23 into one component and fix it to the extended part 20 of the guiderail 1.

Figure 8:
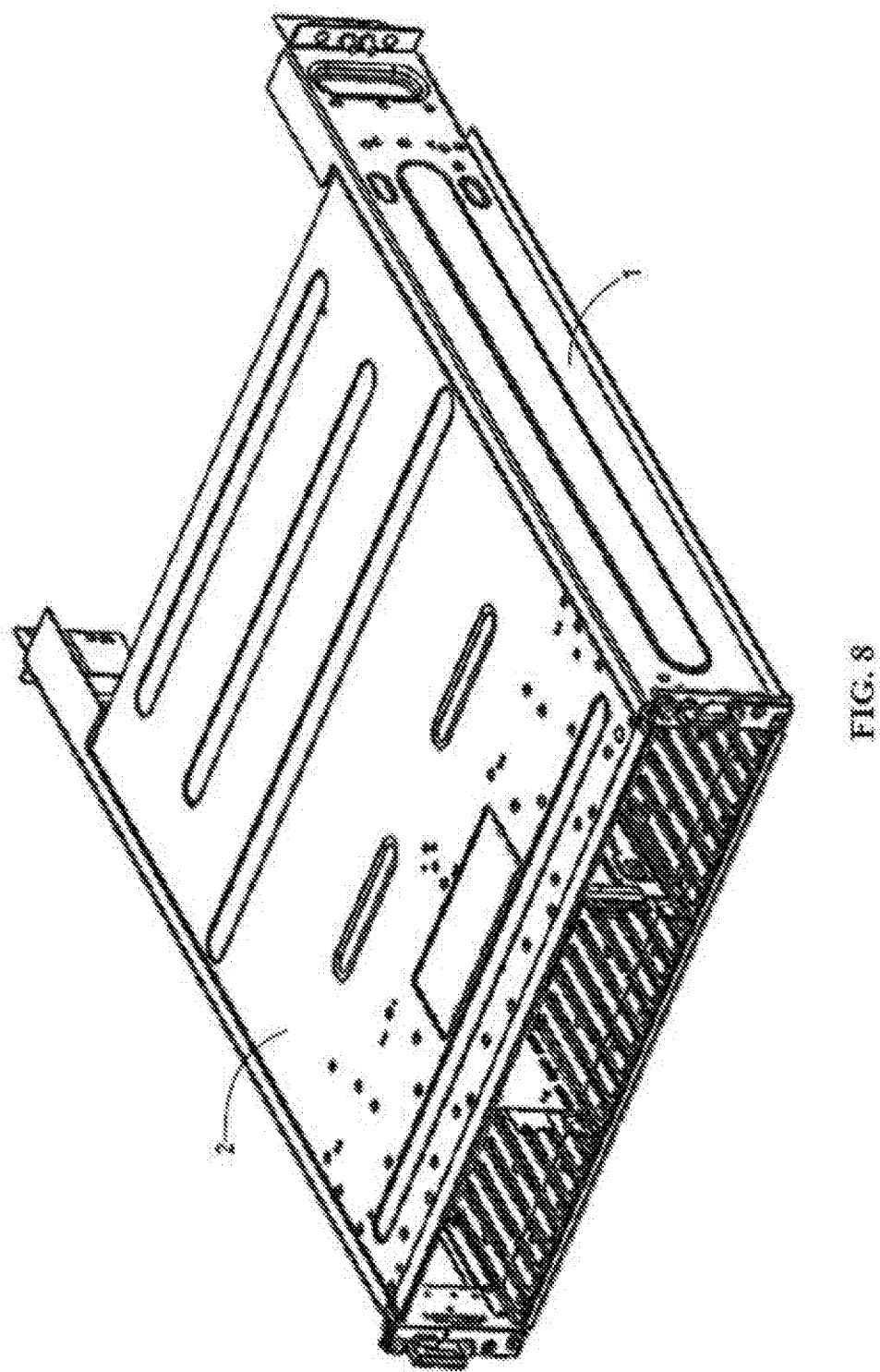
FIG. 8 illustrates a schematic diagram of the guiderail and the chassis according to present disclosure under one working condition.
Figure 9:
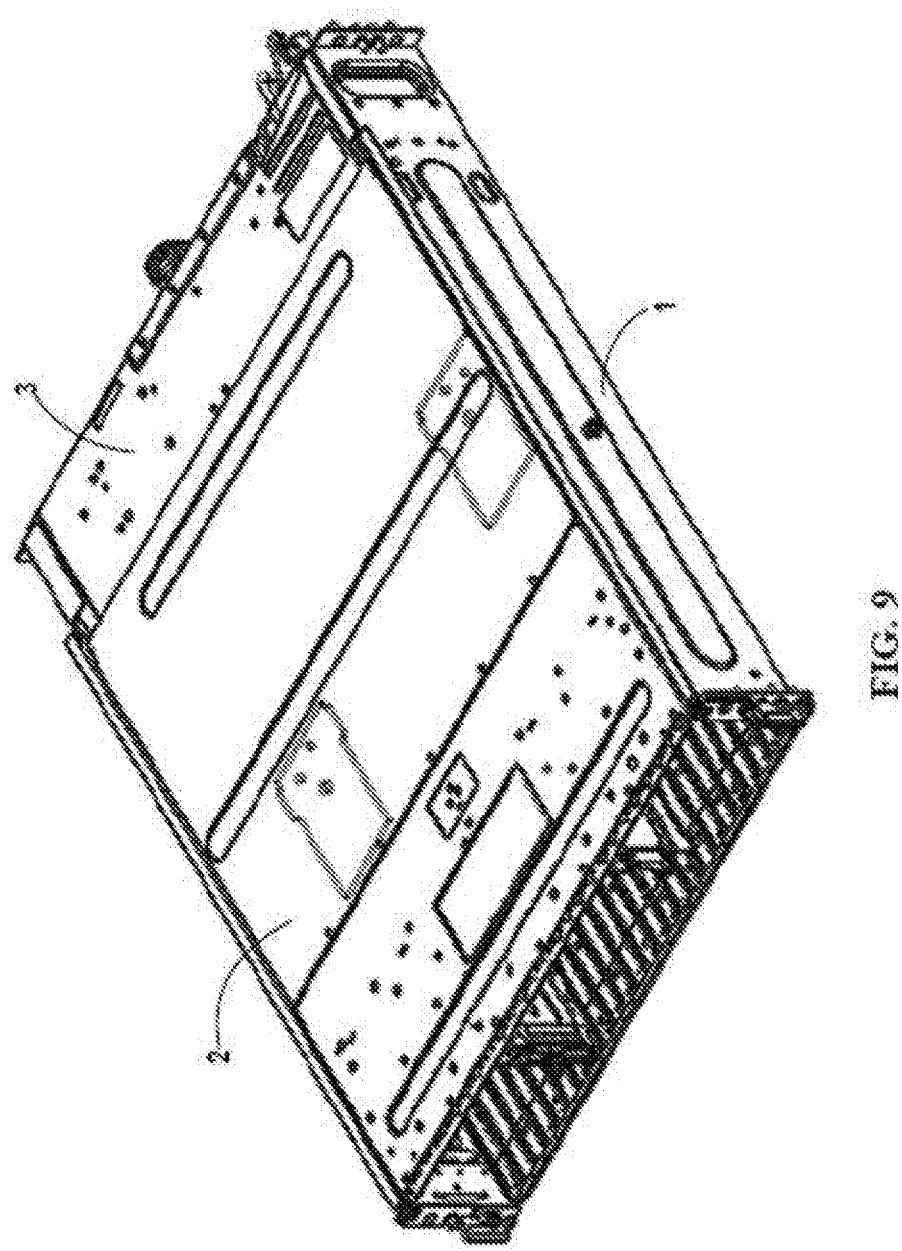
FIG. 9 illustrates a schematic diagram of the guiderail and the chassis according to present disclosure under another working condition.

FIG. 8 and FIG. 9 illustrate the schematic diagram of the guiderail 1 and the chassis 2 under two working conditions. Under a first working condition shown in FIG. 8, the storage processing unit 3 inside the chassis 2 does not extend out of the chassis 2. Then, the main body part 10 of the guiderail 1 supports the chassis 2 while the extended part 20 of the guiderail 1 is vacant. Under a second working condition shown in FIG. 9, as the storage processing unit 3 of a larger dimension is mounted in chassis 2, a portion of the storage processing unit 3 extends to the outside of the chassis 2, where the extended part 20 of the guiderail 1 is used to fix the storage processing unit 3. As can be seen clearly from FIG. 8 and FIG. 9, by means of the guiderail 1, more specifically by means of the extended part 20 of the guiderail 1, storage processing units 3 with different dimensions can share the chassis 2 with the same specification.

Figure 10:
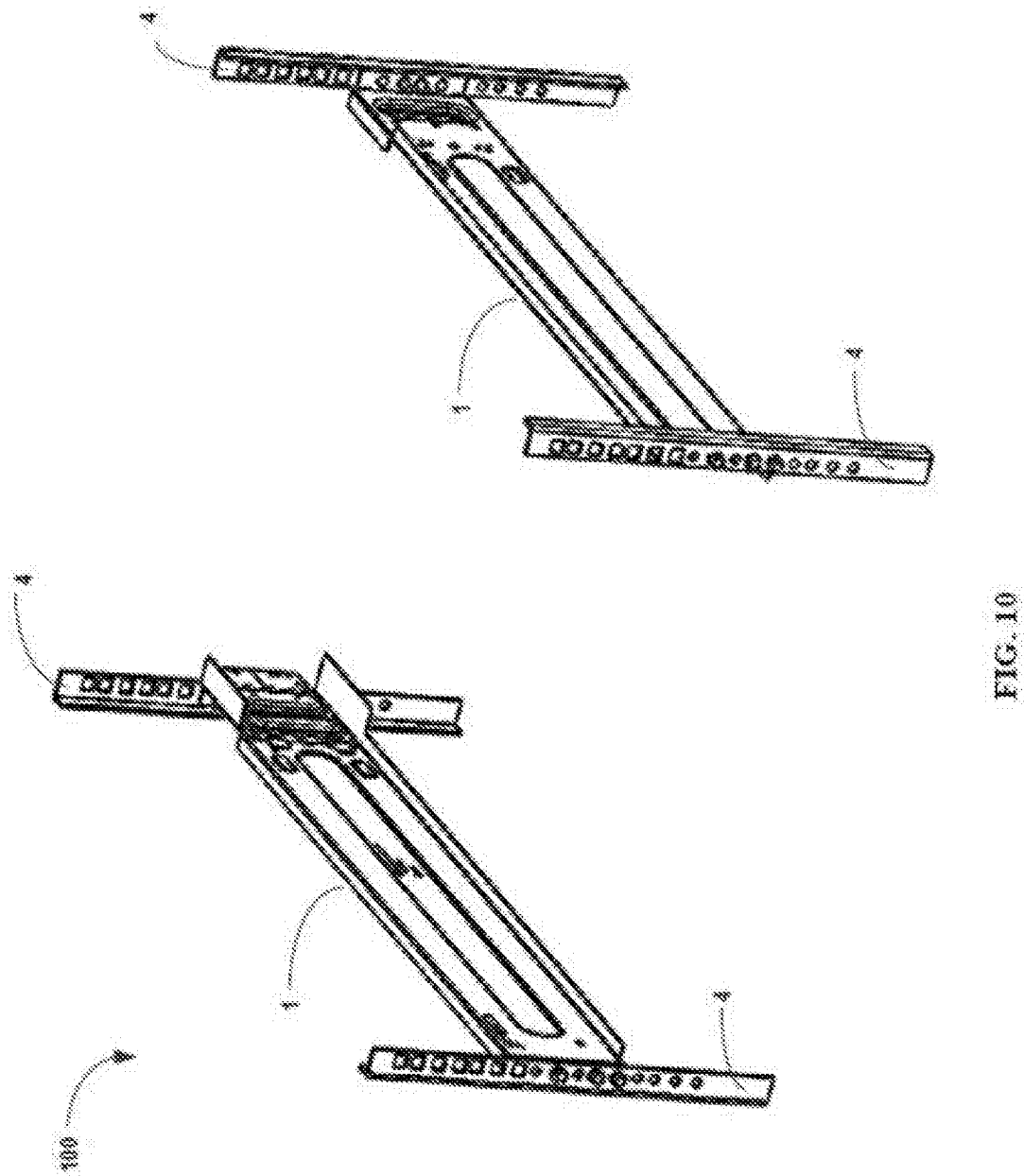
FIG. 10 illustrates a schematic diagram for mounting the guiderail according to present disclosure in the cabinet.
Figure 11:
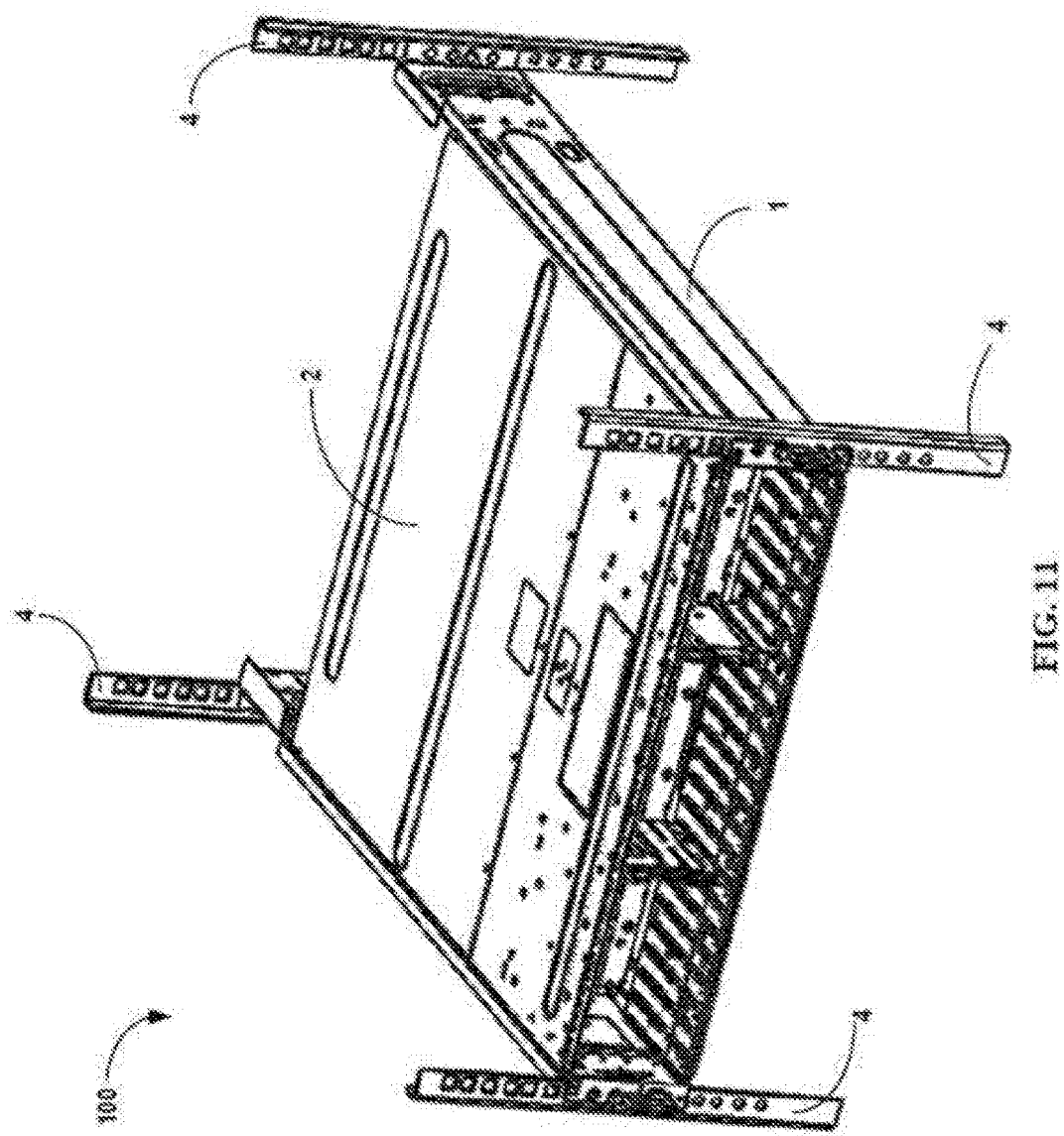
FIG. 11 illustrates a schematic diagram for mounting the chassis in the cabinet with the guiderail according to the embodiments of the present disclosure.

FIG. 10 and FIG. 11 illustrate a schematic diagram for mounting the guiderail 1 in the cabinet 100 and a schematic diagram for mounting the chassis 2 in the cabinet 100 by means of the guiderail 1. For the sake of clarity, only rack 4 of the cabinet 100 for fixing the guiderail is illustrated, which does not exclude the case that the cabinet 100 may include other components.

In the example shown in FIG. 10, optionally, two guiderails 1 are connected to rack 4 at their respective both ends with a bolt. FIG. 10 only illustrates schematically a set of guiderails 1. However, in actual application, more sets of guiderails 1 can be mounted on rack 4 of the cabinet 100 as required to fix more chassis 2.

In the example shown in FIG. 11, the chassis 2 is inserted in the cabinet 100 along the guiderail 1 and also fixed to rack 4 at the front end of the chassis 2 with a bolt. Since the guiderail 1 has an extended part 20, the chassis 2, after being inserted, still has a distance from the back side of the cabinet, which allows the storage processing unit 3 mounted in the chassis 2 to extend from the chassis 2. Thus, it can be seen that storage processing units 3 of different dimensions can be mounted in the chassis 2 of the same specification. In this manner, products of the same generation can have different storage processing units 3 in length or multiple generations of products of the storage processing unit 3 can share the same chassis 2 and the cabinet 100 without specifically customizing the chassis 2 and the cabinet 100 for the storage processing unit 3, saving costs for manufacturing the storage system from the perspective of hardware to a great extent.

By means of the guiderail depicted in the above example embodiments, a chassis of uniform specification can be used to accommodate storage processing units with different dimensions, particularly with different lengths, and to fix them to the cabinet. Moreover, the guiderail enables the chassis and the storage processing unit to be fixed more securely to the cabinet, thereby enhancing the vibration-resistant performance and avoiding the problem of data loss due to mechanical vibration.

Several example embodiments of the present disclosure have been described with reference to the drawings. It should be noted that these example embodiments are not contradictory to each other. Instead, one or more of the example embodiments can be combined in one embodiment.

Although the present disclosure has been described with reference to various embodiments, it should be understood that the present disclosure is not limited to the disclosed embodiments. Those skilled in the art can make amendment or any combination to the features in these embodiments which do not go beyond the scope of protection of the present disclosure.

What is claimed is:

1. A guiderail (1) for use in a cabinet (100), the guiderail (1) being constructed and arranged to mount in the cabinet (100) and to support a chassis (2) which can accommodate storage processing units (3) with different dimensions, the guiderail (1) comprising:
    a main body part (10) for supporting the chassis (2) when the chassis (2) is inserted in the cabinet (100) along the guiderail (1); and
    an extended part (20) for fixing the storage processing units (3) extending from the chassis (2), wherein the extended part extends beyond the main body part.

2. The guiderail (1) according to claim 1, wherein a sidewall of the guiderail (1) is configured to have such a height that the chassis (2) is covered by the sidewall of the guiderail (1) in a vertical direction.

3. The guiderail (1) according to claim 1, further comprising a supporting portion (21) arranged at the lower side of the extended part (20) of the guiderail (1), for supporting the storage processing unit (3) extending from the chassis (2).

4. The guiderail (1) according to claim 3, further comprising a fixing portion (22) arranged at the upper side of the extended part (20) of the guiderail (1), for fixing the storage processing unit (3) extending from the chassis (2) between the supporting portion (21) and the fixing portion (22).

5. The guiderail (1) according to one of claims 1, further comprising at least one embossment (24, 25) arranged on the sidewall of the extended part (20).

6. The guiderail (1) according to claim 5, wherein the embossment (24, 25) and the extended part (20) form a one-piece construction.

7. The guiderail (1) according to claim 5, further comprising a hook (23) for engaging with the chassis (2).

8. The guiderail (1) according to claim 7, wherein the hook (23) is arranged on the sidewall of the main body part (10) of the guiderail (1).

9. The guiderail (1) according to claim 7, wherein the embossment (24) of the at least one embossment adjacent to the main body part (10) of the guiderail (1), and the hook (23) form a separate one-piece construction (26), and the one-piece construction (26) is fixed on the sidewall of the extended part (20) of the guiderail (1).

10. The guiderail (1) according to claim 9, wherein the one-piece construction (26) is made of stainless steel.

11. The guiderail (1) according to one of claims 1, wherein the main body part (10) of the guiderail (1) has a guide groove.

12. An apparatus, comprising:
    a cabinet;
    a chassis for accommodating storage processing units with different dimensions, wherein the chassis is fixable in the cabinet through a guiderail; and
    wherein the guiderail comprises:
        a main body part for supporting the chassis when the chassis is inserted in the cabinet along the guiderail; and
        an extended part for fixing the storage processing units extending from the chassis, wherein the extended part extends beyond the main body part.

13. The apparatus of claim 12, wherein a sidewall of the guiderail is configured to have such a height that the chassis is covered by the sidewall of the guiderail in a vertical direction.

14. The apparatus of claim 12, wherein the guiderail further comprising a supporting portion arranged at the lower side of the extended part of the guiderail, for supporting the storage processing unit extending from the chassis.

15. The apparatus of claim 14, wherein the guiderail further comprising a fixing portion (22) arranged at the upper side of the extended part (20) of the guiderail (1), for fixing the storage processing unit (3) extending from the chassis (2) between the supporting portion (21) and the fixing portion (22).

16. The Apparatus of claim 12, wherein the guiderail further comprising at least one embossment (24, 25) arranged on the sidewall of the extended part (20).

17. A cabinet, comprising:
 a guiderail, the guiderail comprising:
  a main body part for supporting a chassis when the chassis is inserted in the cabinet along the guiderail; and
  an extended part for fixing storage processing units extending from the chassis, wherein the extended part extends beyond the main body part; and
 a chassis being fixable in the cabinet through the guiderail.

18. The cabinet of claim 17, wherein a sidewall of the guiderail is configured to have such a height that the chassis is covered by the sidewall of the guiderail in a vertical direction.

19. The apparatus of claim 17, wherein the guiderail further comprising a supporting portion arranged at the lower side of the extended part of the guiderail, for supporting the storage processing unit extending from the chassis.

20. The apparatus of claim 19, wherein the guiderail further comprising a fixing portion arranged at the upper side of the extended part of the guiderail, for fixing the storage processing unit extending from the chassis between the supporting portion and the fixing portion.

\* \* \* \* \*